US012647130B2

(12) United States Patent
Cho et al.

(10) Patent No.: US 12,647,130 B2
(45) Date of Patent: Jun. 2, 2026

(54) COMPRESSOR FOR COMPRESSING CONTROL SIGNAL, DECOMPRESSOR FOR DECOMPRESSING CONTROL SIGNAL, AND STORAGE DEVICE INCLUDING THE COMPRESSOR AND THE DECOMPRESSOR

(71) Applicant: Samsung Electronics Co., Ltd., Suwon-si (KR)

(72) Inventors: Insang Cho, Suwon-si (KR); Changhyun Joo, Suwon-si (KR); Wookghee Hahn, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 19/012,246

(22) Filed: Jan. 7, 2025

(65) Prior Publication Data

US 2025/0373266 A1    Dec. 4, 2025

(30) Foreign Application Priority Data

Jun. 4, 2024    (KR) ........................ 10-2024-0073184

(51) Int. Cl.
| | |
|---|---|
| *H03M 7/46* | (2006.01) |
| *G11C 16/04* | (2006.01) |
| *G11C 16/08* | (2006.01) |
| *H03M 7/30* | (2006.01) |

(52) U.S. Cl.
CPC ........... *H03M 7/46* (2013.01); *G11C 16/0483* (2013.01); *H03M 7/6064* (2013.01); *H03M 7/70* (2013.01); *G11C 16/08* (2013.01)

(58) Field of Classification Search
CPC ........ H03M 7/46; H03M 7/6064; H03M 7/70; G11C 16/0483; G11C 16/08
See application file for complete search history.

(56) References Cited

U.S. PATENT DOCUMENTS

| | | | |
|---|---|---|---|
| 9,236,129 B2 | 1/2016 | Jeon | |
| 9,946,468 B2 | 4/2018 | Conley et al. | |
| 10,382,749 B2 | 8/2019 | Seregin et al. | |
| 11,899,934 B2 | 2/2024 | Fukazawa et al. | |
| 2013/0202201 A1* | 8/2013 | Park ...................... | H04N 19/60 |
| | | | 382/233 |
| 2015/0341635 A1 | 11/2015 | Seregin et al. | |
| 2021/0075456 A1* | 3/2021 | Orhan ..................... | H03M 7/70 |
| 2022/0404887 A1* | 12/2022 | Cruise ................... | G06F 1/3203 |

* cited by examiner

*Primary Examiner* — Nicholas J Simonetti
(74) *Attorney, Agent, or Firm* — Harness, Dickey & Pierce, P.L.C.

(57) ABSTRACT

A compressor for compressing a control signal includes residual compression circuitry configured to sequentially receive a first control signal and a second control signal and perform compression based on a difference between the first control signal and the second control signal, coding mode determination circuitry configured to determine a coding mode based on a type of control signal, analog signal compression circuitry configured to perform compression based on indexing, and control signal compression circuitry configured to perform compression based on run-length encoding (RLE).

20 Claims, 11 Drawing Sheets

LUT

LUT[0] : ......
LUT[1] : ......
LUT[2] : ......
LUT[3] : ......
LUT[4] : ......
LUT[5] : ......
... :
LUT[15] : ......

LUT[3:0][15:0]

WL[300:0][3:0]

811

800

803

WL[300:0][15:0]

801

COMPRESSOR FOR COMPRESSING CONTROL SIGNAL, DECOMPRESSOR FOR DECOMPRESSING CONTROL SIGNAL, AND STORAGE DEVICE INCLUDING THE COMPRESSOR AND THE DECOMPRESSOR

CROSS-REFERENCE TO RELATED APPLICATION

This application is based on and claims priority under 35 U.S.C. § 119 to Korean Patent Application No. 10-2024-0073184, filed on Jun. 4, 2024, in the Korean Intellectual Property Office, the disclosure of which is incorporated by reference herein in its entirety.

BACKGROUND

1. Field

The disclosure relates to storage devices, and more particularly, to compressors for compressing control signals, decompressors for decompressing control signals, and storage devices including the compressor and the decompressor.

2. Description of the Related Art

Flash memory is a nonvolatile memory device capable of retaining stored data even when power is turned off. Recently, storage devices including flash memory such as an embedded multi-media card (eMMC), a universal flash storage (UFS), a solid state drive (SSD), and memory cards have been widely used, and such storage devices may be effectively used for storing or transferring large amounts of data. In the process of increasing the storage capacity of such devices, the complexity of NAND flash memory cells increases, leading to an increase in the number of control algorithms and the number of control signals. In addition, the number of options for verifying the characteristics of memory cells has also exponentially increased.

With the increase in the number of control signals and the complexity of NAND flash memory cells caused by an increase in the number of word lines, the existing connection methods will soon reach their limits. Thus, solutions are needed. A method of facilitating control signal routing and decreasing the size of control signals by compressing and decompressing control signals has emerged as a solution.

SUMMARY

Provided are compressors for compressing control signals, decompressors for decompressing control signals, and storage devices including the compressor and the decompressor.

Additional aspects will be set forth in part in the description which follows and, in part, will be apparent from the description, or may be learned by practice of the presented example embodiments of the disclosure.

According to an example embodiment of the disclosure, a compressor for compressing a control signal includes a residual compression circuitry configured to sequentially receive a first control signal and a second control signal and perform a first compression based on a difference between the first control signal and the second control signal, a coding mode determination circuitry configured to determine a coding mode based on a type of control signal, an analog signal compression circuitry configured to perform a second compression based on indexing, and a control signal compression circuitry configured to perform a third compression based on run-length encoding (RLE).

According to an example embodiment of the disclosure, a memory system includes an external device and a storage device. The external device includes a compressor configured to generate a compressed control signal by compressing data for identifying characteristics of storage device memory cells. The storage device includes an external NAND control (ENC) circuit and a nonvolatile memory device. The ENC circuit includes a buffer memory and a decompressor. The buffer memory is configured to store the compressed control signal and the decompressor is configured to generate a control signal by performing decompression based on the compressed control signal. The nonvolatile memory device includes a memory cell array. The data includes control information for implementing a hardware algorithm.

According to an example embodiment of the disclosure, a storage device includes a compressor, a decompressor, and a nonvolatile memory device. The compressor includes a residual compression circuitry, coding mode determination circuitry, analog signal compression circuitry, and control signal compression circuitry. The residual compression circuitry is configured to sequentially receive a first control signal and a second control signal and perform a first compression based on a difference between the first control signal and the second control signal, the coding mode determination circuitry is configured to determine a coding mode based on a type of control signal, the analog signal a second compression circuitry is configured to perform compression based on indexing, and the control signal compression circuitry is configured to perform a third compression based on RLE. The decompressor includes coding mode determination circuitry, an analog signal decompression circuitry, a control signal decompression circuitry, and residual determination circuitry. The coding mode determination circuitry is configured to determine a coding mode based on a type of control signal, the analog signal decompression circuitry configured to perform a first decompression based on indexing, the control signal decompression circuitry is configured to perform a second decompression based on RLE, and the residual determination circuitry is configured to identify the difference between the first control signal and the second control signal. The nonvolatile memory device includes a memory cell array, a voltage generator, a row decoder, and a page buffer.

BRIEF DESCRIPTION OF THE DRAWINGS

The above and other aspects, features, and advantages of certain example embodiments of the disclosure will be more apparent from the following description taken in conjunction with the accompanying drawings, in which.

3

Figure 7:
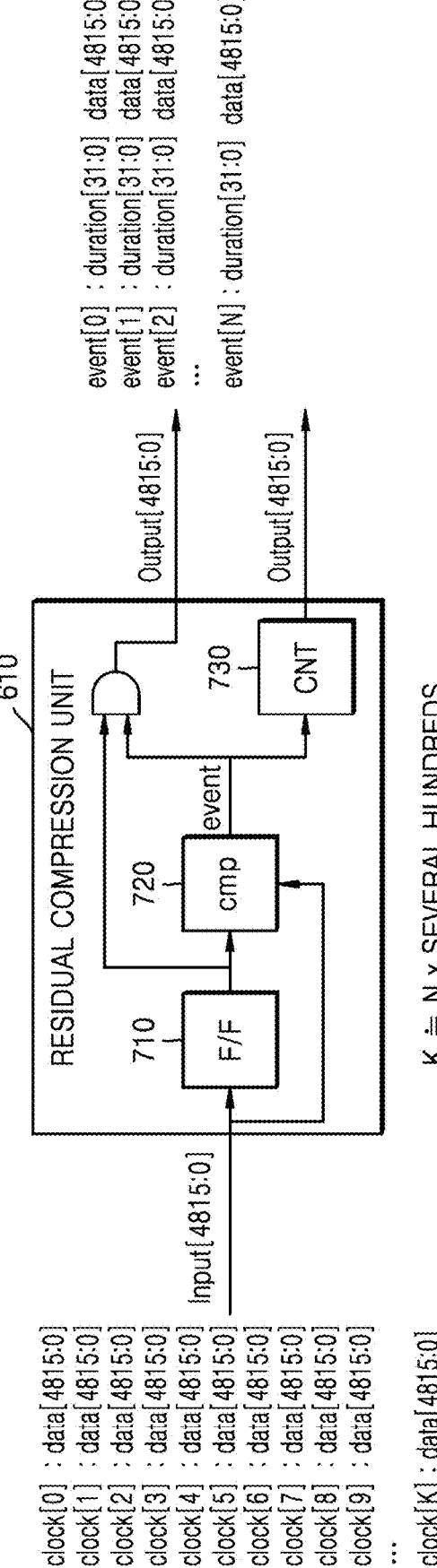
Figure 9:
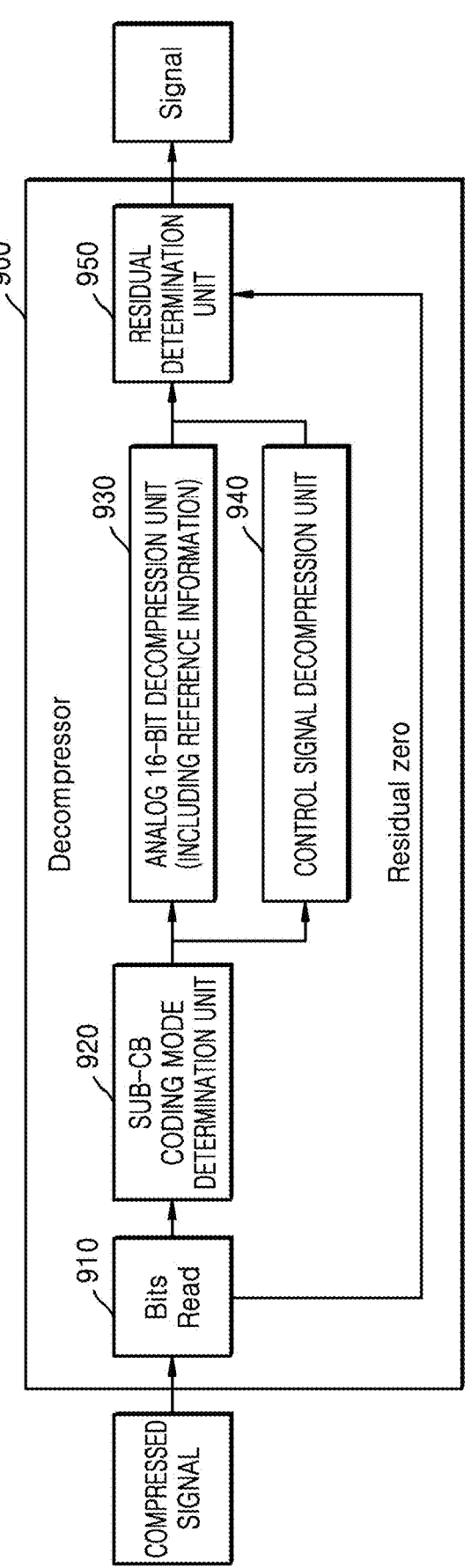
Figure 10:
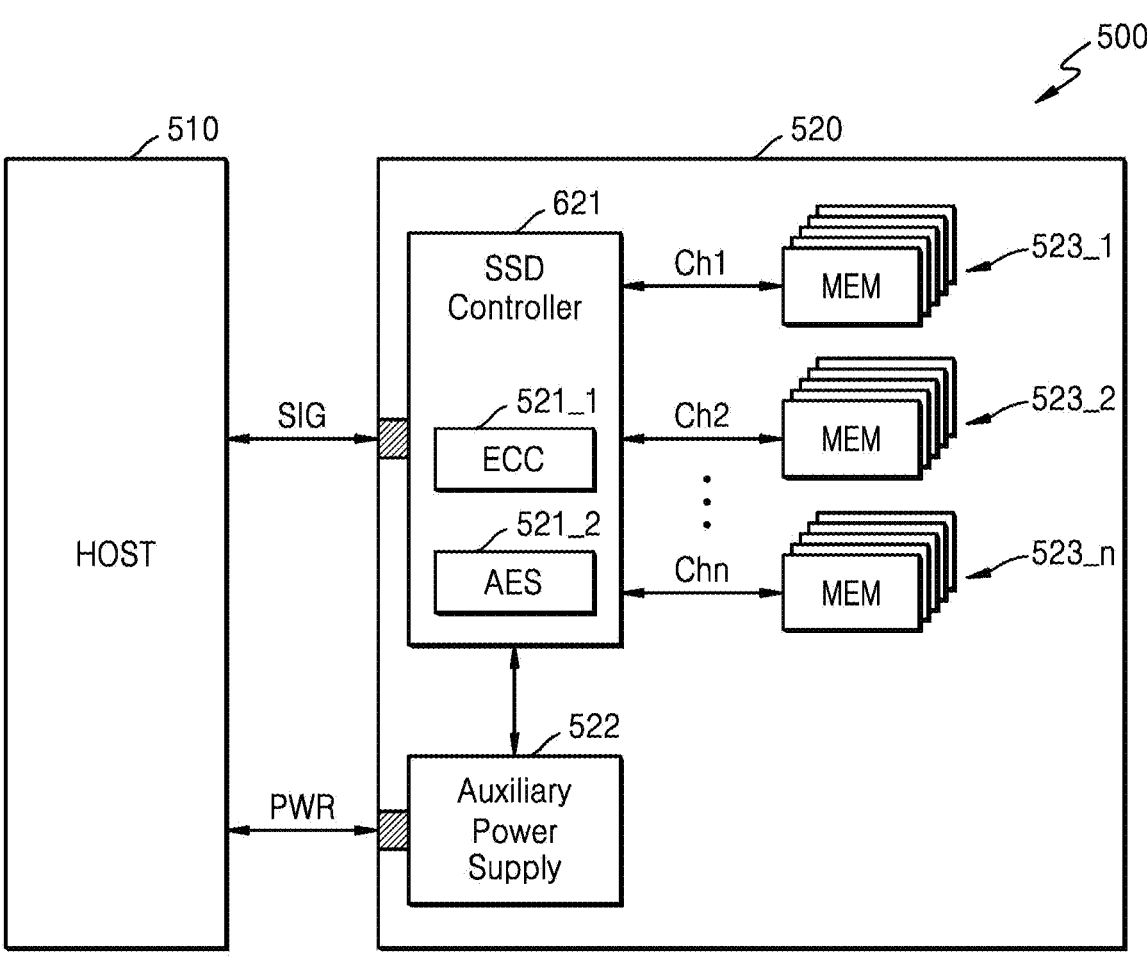

FIG. 7 is a block diagram illustrating a residual compression unit according to an example embodiment;

Figure 8:
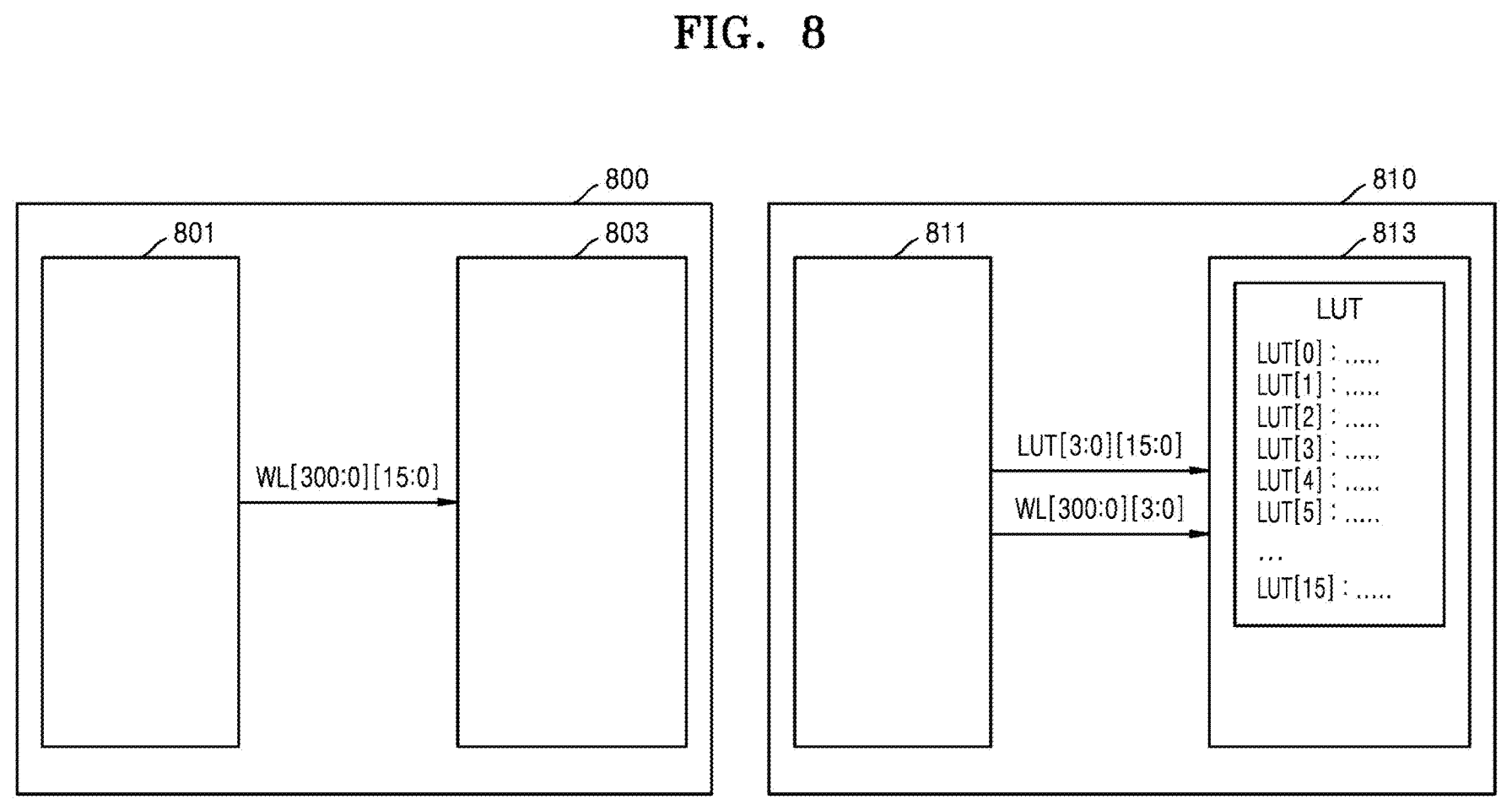

FIG. 8 is a diagram illustrating, by example, results obtained by an analog signal compression unit according to an example embodiment;

FIG. 9 is a block diagram illustrating a decompressor according to an example embodiment; and FIG. 10 is a block diagram illustrating an example of applying memory devices to a solid state drive (SSD) system according to example embodiments.

DETAILED DESCRIPTION

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terms used in the disclosure are general terms currently widely used in the art in consideration of functions regarding the disclosure, but the terms may vary according to the intention of those of ordinary skill in the art, precedents, or new technology in the art. Also, some terms may be arbitrarily selected by the applicant, and in this case, the meaning of the selected terms will be described in the detailed description of the disclosure. Thus, the terms used herein should not be construed based on only the names of the terms but should be construed based on the meaning of the terms together with the description throughout the disclosure.

In the following descriptions of the disclosure, when a portion or element is referred to as being connected to another portion or element, the portion or element may be directly connected to the other portion or element, or may be electrically connected to the other portion or elements with intervening portions or elements being therebetween. It will be further understood that the terms "comprises" and/or "comprising" used herein specify the presence of stated features or elements, but do not preclude the presence or addition of one or more other features or elements.

In the following descriptions of embodiments, expressions or terms such as "constituted by," "formed by," "include," "comprise," "including," and "comprising" should not be construed as always including all specified elements, processes, or operations, but may be construed as not including some of the specified elements, processes, or operations, or further including other elements, processes, or operations.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Although the terms "first," "second," "third," etc., may be used herein to describe various elements, operations, components, regions, layers, and/or sections, these elements, operations, components, regions, layers, and/or sections, should not be limited by these terms. These terms are only used to distinguish one element, operation, component, region, layer, or section, from another element, operation, component, region, layer, or section. Thus, a first element, operation, component, region, layer, or section, discussed below may be termed a second element, operation, component, region, layer, or section, without departing from the scope of this disclosure.

The following descriptions of some example embodiments should not be construed as limiting the scope of the disclosure, and modifications or changes that could be easily made from the disclosed example embodiments by those of ordinary skill in the art should be construed as being included in the scope of the inventive concepts. Hereinafter, some example embodiments will be described with reference to the accompanying drawings. In the drawings, like reference numerals denote like elements, and repeated descriptions thereof are omitted.

Hereinafter, some example embodiments will be described with reference to the accompanying drawings.

Figure 1A:
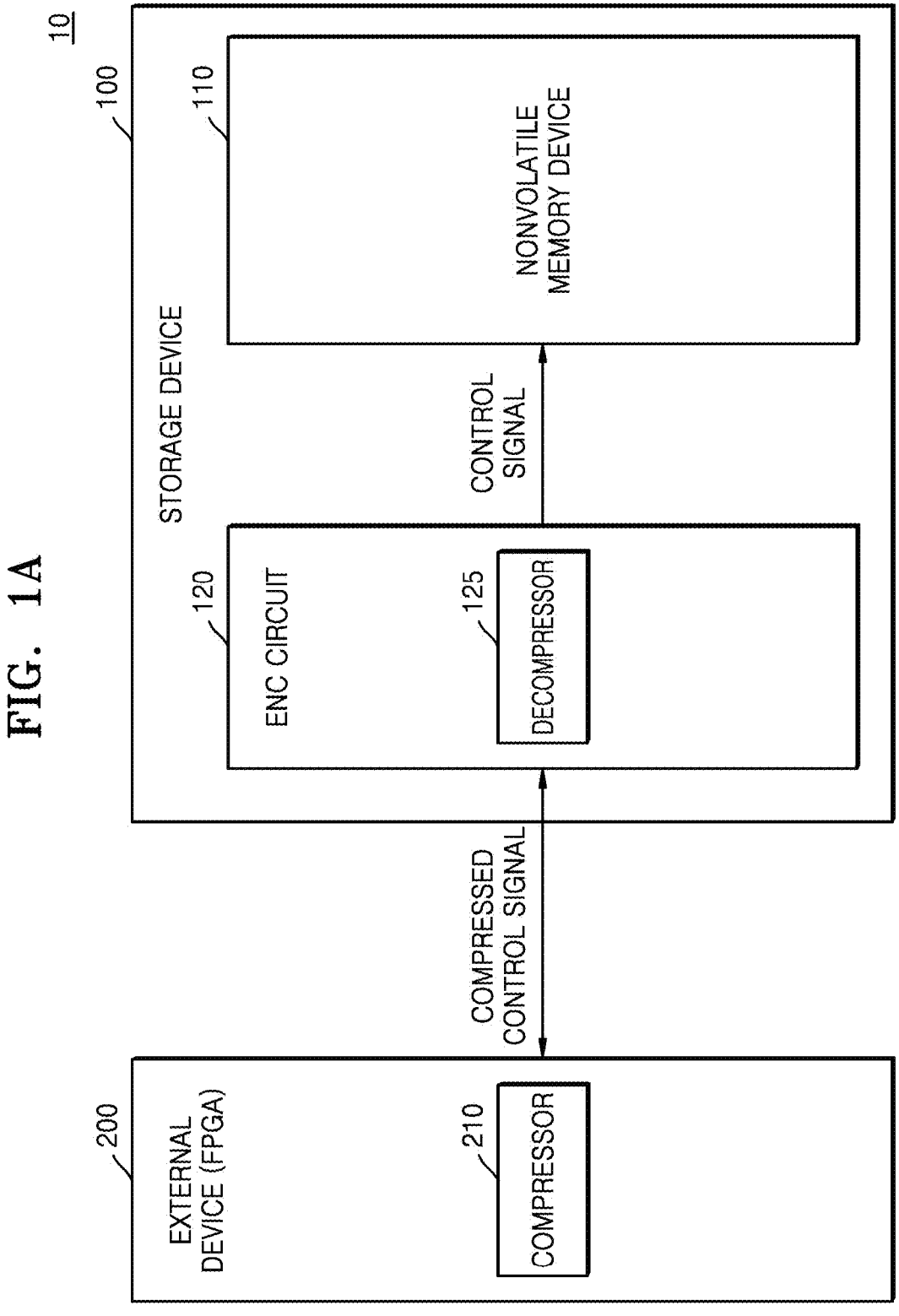
FIG. 1A is a diagram illustrating an example of a memory system according to an example embodiment.

FIG. 1A illustrates an example of a memory system 10 according to an example embodiment.

Referring to FIG. 1A, the memory system 10 may include a storage device 100 and an external device 200. The external device 200 may correspond to FPGA (field programmable gate array). The storage device 100 may include a nonvolatile memory device 110 and an external NAND control (ENC) circuit 120.

According to an example embodiment, the external device 200 may transmit a compressed control signal to the storage device 100. For example, the external device 200 may further include a compressor 210. The compressor 210 may generate a compressed control signal by compressing, in terms of time and data, a control signal that is to be transmitted to the storage device 100. A time-based compression method may be based on a method of transmitting data only once along with information on the duration of repetition when the same data repeats in a control signal. A data-based compression method may be based on a method of indexing an analog signal based on hardware characteristics of NAND flash and transmitting only index information. Further descriptions thereof are provided below. The external device 200 may provide the storage device 100 with a compressed control signal generated using the compressor 210.

According to an example embodiment, the external device 200 may include a plurality of compressors, and the compressors may compress control signals in parallel. In this case, the external device 200 may further include a serializer configured to serialize control signals generated in parallel into one stream.

According to an example embodiment, control signals may refer to signals for implementing a new algorithm for testing characteristics of memory cells of the storage device 100 in terms of hardware. For example, the algorithm may at least include information about a sequence of applying word line voltages and information about the degree of variation in word line voltage (e.g., the slope of a word line voltage).

According to an example embodiment, the nonvolatile memory device 110 may write data received in response to a write command to a memory cell array or may read data stored at an address in response to a read command.

According to an example embodiment, the ENC circuit 120 may generate a control signal for controlling the nonvolatile memory device 110. For example, the ENC circuit 120 may further include a decompressor 125. The decompressor 125 may receive a compressed control signal from the external device 200 and decompress the compressed control signal to obtain a control signal. The ENC circuit 120 may apply the control signal obtained by decompression to the nonvolatile memory device 110 to identify characteristics of memory cells of a memory cell array (e.g., refer to a memory cell array 111 shown in FIG. 2).

That is, according to an example embodiment, the ENC circuit 120 may generate a control signal by decompressing a compressed control signal received from the external device 200 and may variously test the characteristics of memory cells of the nonvolatile memory device 110 based on the control signal.

Figure 1B:
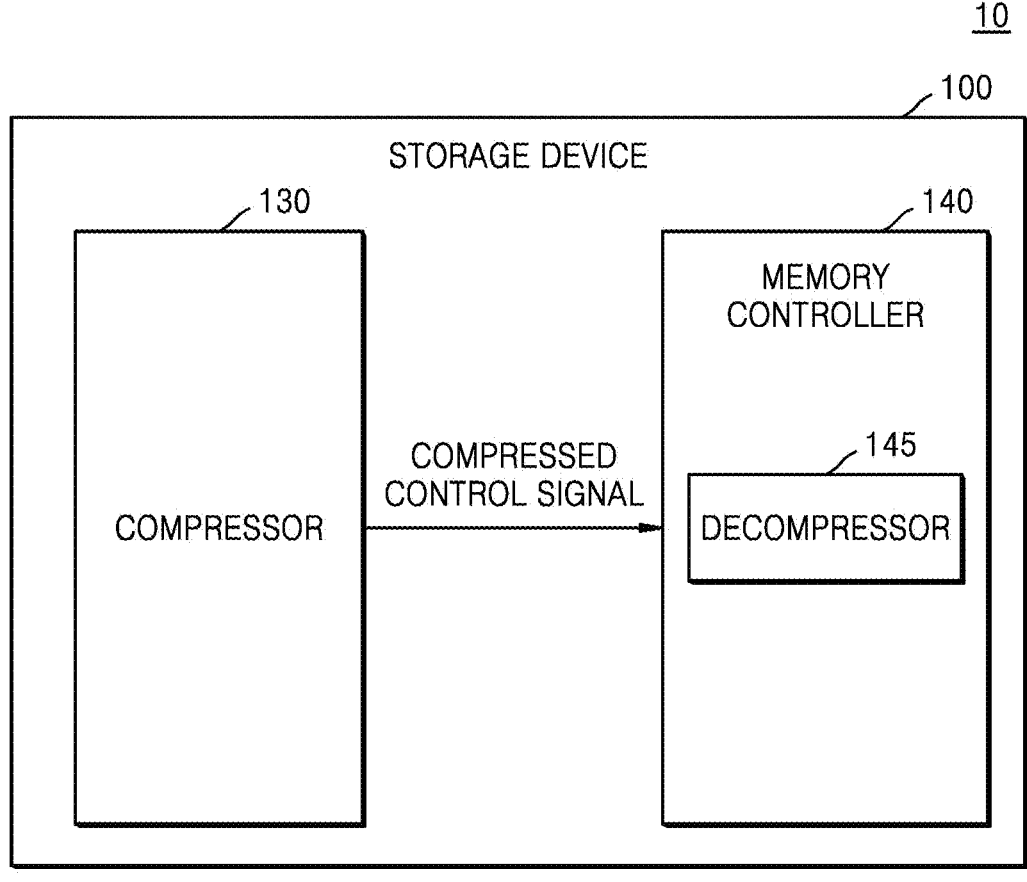
FIG. 1B is a diagram illustrating an example of a storage device according to an example embodiment.

FIG. 1B illustrates an example of the storage device 100 according to an example embodiment.

Referring to FIG. 1B, the storage device 100 may include a compressor 130 and a memory controller 140.

FIG. 1A illustrates that the compressor 210 is included in the external device 200 outside the storage device 100 and compresses control signals to be transmitted from the external device 200 to the storage device 100. Referring to FIG. 1B, the compressor 130 may be included inside the storage device 100. Therefore, the compressor 130 may also convert control signals used inside the storage device 100 into compressed control signals. When the compressor 130 compresses control signals, the control signals may be more easily routed inside the storage device 100.

The memory controller 140 may control a nonvolatile memory device (e.g., the nonvolatile memory device 110 shown in FIG. 1A) in response to a write or read request received from a host. For example, the memory controller 140 may transmit a command CMD and an addresses ADDR to the nonvolatile memory device in response to a write or read request received from the host. The memory controller 140 may exchange data DATA with the nonvolatile memory device. For example, when the command CMD is a write command CMD_w, the nonvolatile memory device may write data DATA received from the memory controller 140 to a memory cell array (e.g., the memory cell array 111 shown in FIG. 2), and when the command CMD is a read command CMD_r, the nonvolatile memory device may output, to the memory controller 140, data DATA stored at the address ADDR received from the memory controller 140.

According to an example embodiment, the memory controller 140 may generate a control signal for controlling the nonvolatile memory device. For example, the memory controller 140 may further include a decompressor 145. The decompressor 145 may receive a compressed control signal from the compressor 130 and decompress the compressed control signal to obtain a control signal. The memory controller 140 may apply the control signal obtained by decompression to the nonvolatile memory device.

That is, according to an example embodiment, the storage device 100 includes the compressor 130, thereby reducing the burden of routing large control signals inside the storage device 100 while transmitting and receiving relatively small, compressed control signals.

Figure 2:
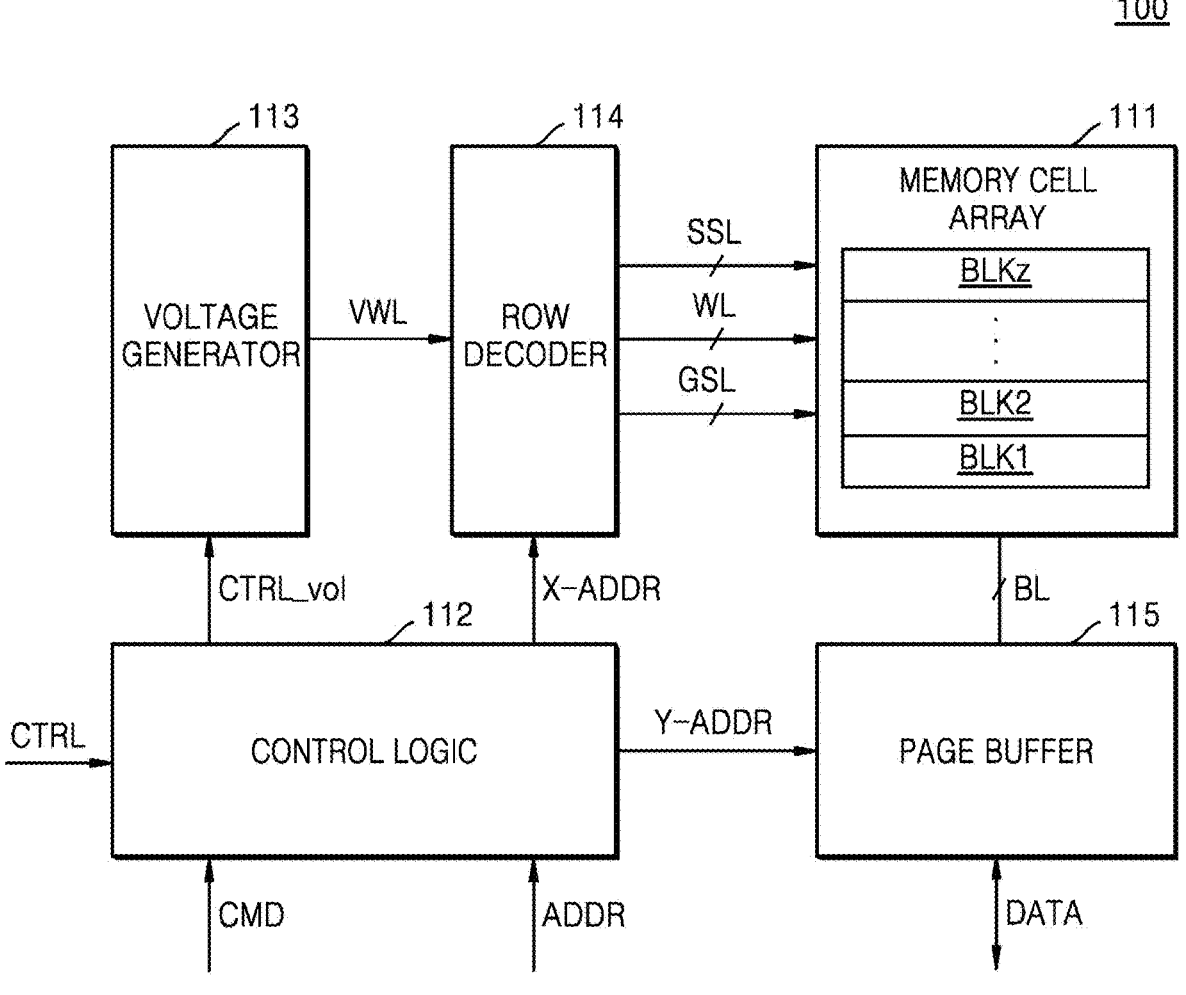
FIG. 2 is a block diagram illustrating a storage device according to an example embodiment.

FIG. 2 is a block diagram illustrating a storage device 100 according to an example embodiment.

Referring to FIG. 2, the storage device 100 may include a nonvolatile memory device 110 (refer to FIG. 1A) and an ENC circuit 120 (refer to FIG. 1A). The nonvolatile memory device 110 may include a memory cell array 111, control logic 112, a voltage generator 113, a row decoder 114, and a page buffer 115. Although not shown in FIG. 2, the storage device 100 may further include a data input/output circuit or an input/output interface.

The memory cell array 111 may include a plurality of memory cells and may be connected to word lines WL, string selection lines SSL, ground selection lines GSL, and bit lines BL. For example, the memory cell array 111 may be connected to the row decoder 114 through the word lines WL, the string selection lines SSL, and the ground selection lines GSL, and may be connected to the page buffer 115 through the bit lines BL.

The memory cell array 111 may include a plurality of memory blocks BLK1 to BLKz. For example, each of the memory blocks BLK1 to BLKz may have a 3D structure (or vertical structure). For example, each of the memory blocks BLK1 to BLKz may include structures extending in first to third directions. For example, each of the memory blocks BLK1 to BLKz may include a plurality of NAND strings (hereinafter referred to as 'strings') extending in the third direction. In this case, the strings may be provided apart from each other by a certain distance in the first and second directions. The memory blocks BLK1 to BLKz may be selected by the row decoder 114. For example, the row decoder 114 may select a memory block corresponding to a memory block address from among the memory blocks BLK1 to BLKz.

Each of the memory cells included in the memory cell array 111 may store at least two bits. For example, each of the memory cells may be a multi-level cell (MLC) storing 2-bit data. In another example, each of the memory cells may be a triple-level cell (TLC) storing 3-bit data. In another example, each of the memory cells may be a quad-level cell (QLC) storing 4-bit data. However, example embodiments are not limited thereto. In other example embodiments, some memory cells included in the memory cell array 111 may each be a single-level cell (SLC) storing 1-bit data, and the rest of the memory cells included in the memory cell array 111 may each be an MLC.

The memory blocks BLK1 to BLKz may include at least one selected from an SLC block including SLCs, an MLC block including MLCs, a TLC block including TLC s, and a QLC block including QLCs. Among the memory blocks BLK1 to BLKz included in the memory cell array 111, some memory blocks may be SLC blocks, and the other memory blocks may be MLC blocks or TLC blocks.

When an erase voltage is applied to the memory cell array 111, the memory cells are in an erased state, and when a program pulse is applied to the memory cell array 111, the memory cells are in a programmed state. In this case, each of the memory cells may have an erased state or at least one programmed state that is distinguished by a threshold voltage $V_{th}$.

After the memory cells switch from the erased state to a programmed state in response to a program pulse corresponding to the programmed state, the memory cells may be divided into a plurality of cell groups according to the speed of programming based on a Gaussian distribution of threshold voltages of the memory cells. For example, when the memory cells are QLCs each configured to be programmed with 4 bits, the memory cells may each have an erased state or one of first to fifth programmed states.

The control logic 112 may output various control signals for writing data to the memory cell array 111 or reading data from the memory cell array 111 based on a command CMD, an address ADDR, and a control signal CTRL received from a memory controller 140 (refer to FIG. 1B). Thus, the control logic 112 may generally control various operations in the nonvolatile memory device 110.

Various control signals output from the control logic 112 may be provided to the voltage generator 113, the row decoder 114, and the page buffer 115. The control logic 112 may provide a voltage control signal CTRL_vol to the voltage generator 113. In an example embodiment, the control logic 112 may generate a voltage control signal CTRL_vol to control generation of a program pulse and a verification voltage that are to be provided to the memory cell array 111 for writing data to the memory cells.

The control logic 112 may control the voltage generator 113 such that the voltage generator 113 may generate at least one verification voltage and at least one program pulse in each program loop. In addition, the control logic 112 may control the voltage generator 113 such that the voltage generator 113 may generate a program pulse having a level varying as the number of program loops increases. For example, the control logic 112 may control the voltage generator 113 such that the voltage generator 113 may generate a program pulse having a level increased by a step voltage as the number of program loops increases.

The voltage generator 113 may generate various types of voltages to perform program, read, and erase operations on the memory cell array 111 based on a voltage control signal CTRL_vol. The voltage generator 113 may generate word line voltages VWL, for example, program pulses and verification voltages.

The row decoder 114 may select some word lines WL from among the word lines WL in response to a row address X-ADDR received from the control logic 112. For example, in a program operation, the row decoder 114 may provide a program pulse to the selected word lines WL. In addition, the row decoder 114 may select some string selection lines SSL from among the string selection lines or some ground selection lines GSL from among the ground selection lines GSL in response to a row address X-ADDR received from the control logic 112.

The page buffer 115 may be connected to the memory cell array 111 through the bit lines BL and may select some bit lines BL from among the bit lines BL in response to a column address Y-ADDR received from the control logic 112. In a read operation, the page buffer 115 may operate as a sense amplifier to sense data DATA stored in the memory cell array 111. Furthermore, in a program operation, the page buffer 115 may operate as a write driver such that data DATA to be stored in the memory cell array 111 may be input to the page buffer 115. The page buffer 115 may store data DATA that is read from the memory cell array 111 or data DATA that is to be written to the memory cell array 111.

Figure 3:
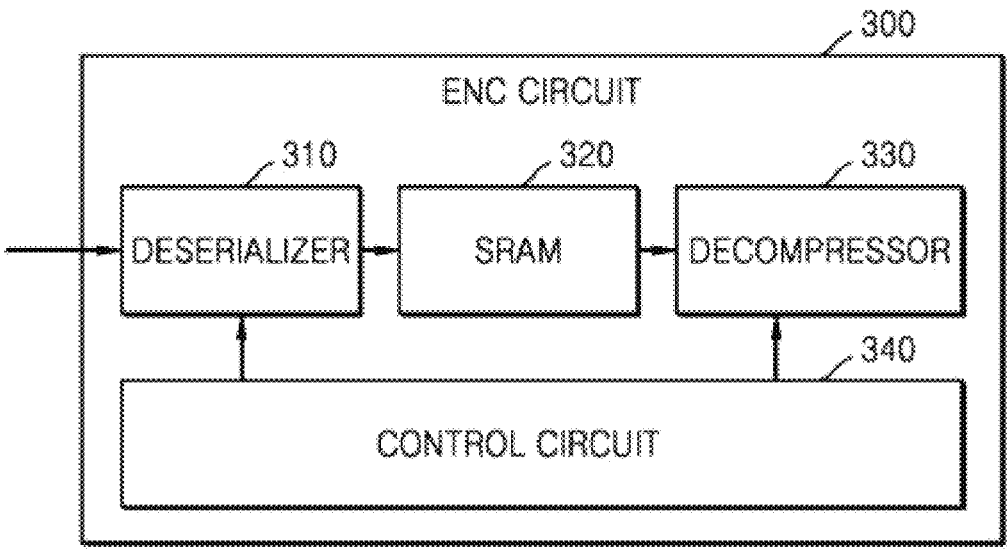
FIG. 3 is a block diagram illustrating an external NAND control (ENC) circuit according to an example embodiment.

FIG. 3 is a block diagram illustrating an ENC circuit 300 according to an example embodiment.

Referring to FIG. 3, the ENC circuit 300 may correspond to the ENC circuit 120 shown in FIG. 1A. The ENC circuit 300 may include a deserializer 310, static random access memory (SRAM) 320, a decompressor 330, and a control circuit 340.

According to an example embodiment, when the external device 200 (refer to FIG. 1A) includes a plurality of compressors and generates a plurality of compressed control signals by compressing a plurality of control signals in parallel, the ENC circuit 300 may include the deserializer 310.

The deserializer 310 may receive a single data stream from an external device (e.g., the external device 200 shown in FIG. 1A) and divide the received data stream into a plurality of streams. For example, the deserializer 310 may divide received data. When the deserializer 310 is an 8:1 deserializer, the deserializer 310 may divide the received data into eight streams. The deserializer 310 may reduce the number of physical ports by allowing the external device 200 to transmit data at a relatively high frequency by considering that the operational frequency of the nonvolatile memory device 110 (refer to FIG. FIG. 1A) is 12.5 MHz or about 12.5 MHz or 25 MHz or about 25 MHz. For example, during an 8:1 operation, 1,024 control signals may be transmitted by transmitting 128 control signals at a frequency multiplied by 8 to reduce an interface size between the external device 200 and the storage device 100 to one-eighth. The deserializer 310 may provide the SRAM 320 with the streams obtained by dividing the received data.

The SRAM 320 may operate as buffer memory for storing output signals of the deserializer 310. In this case, dual-port SRAM that is operable with different operational frequencies at two ports may be used to operate the deserializer 310 and the nonvolatile memory device 110 at different operational frequencies and thus to improve efficiency. For example, the operational frequency of the deserializer 310 may correspond to an optimal or a desired frequency for stable transmission, and the operational frequency of the nonvolatile memory device 110 may correspond to a target frequency of an algorithm of an operational scenario. The SRAM 320 is further described below.

The decompressor 330 may perform decompression to generate control signals. For example, the decompressor 330 may receive compressed control signals stored in the SRAM 320 and generate control signals based on the received compressed control signals.

The control circuit 340 may control the overall operation of the ENC circuit 300. For example, the control circuit 340 may control the deserializer 310 to divide data into data streams and store the data streams in the SRAM 320. In addition, the control circuit 340 may control the decompressor 330 to generate a control signal by decompressing a compressed control signal stored in the SRAM 320, and may apply the generated control signal to the nonvolatile memory device 110 to test characteristics of memory cells.

Any of the blocks in FIG. 3 may communicate with any other of the blocks in FIG. 3, for example in one or more of a one-to-one, one-to-many, or broadcast manner, through a wired and/or wireless bus, to exchange information, such as but not limited to data and/or commands, in formats such as but not limited to digital and/or analog formats, in a serial and/or a parallel manner.

Figure 4:
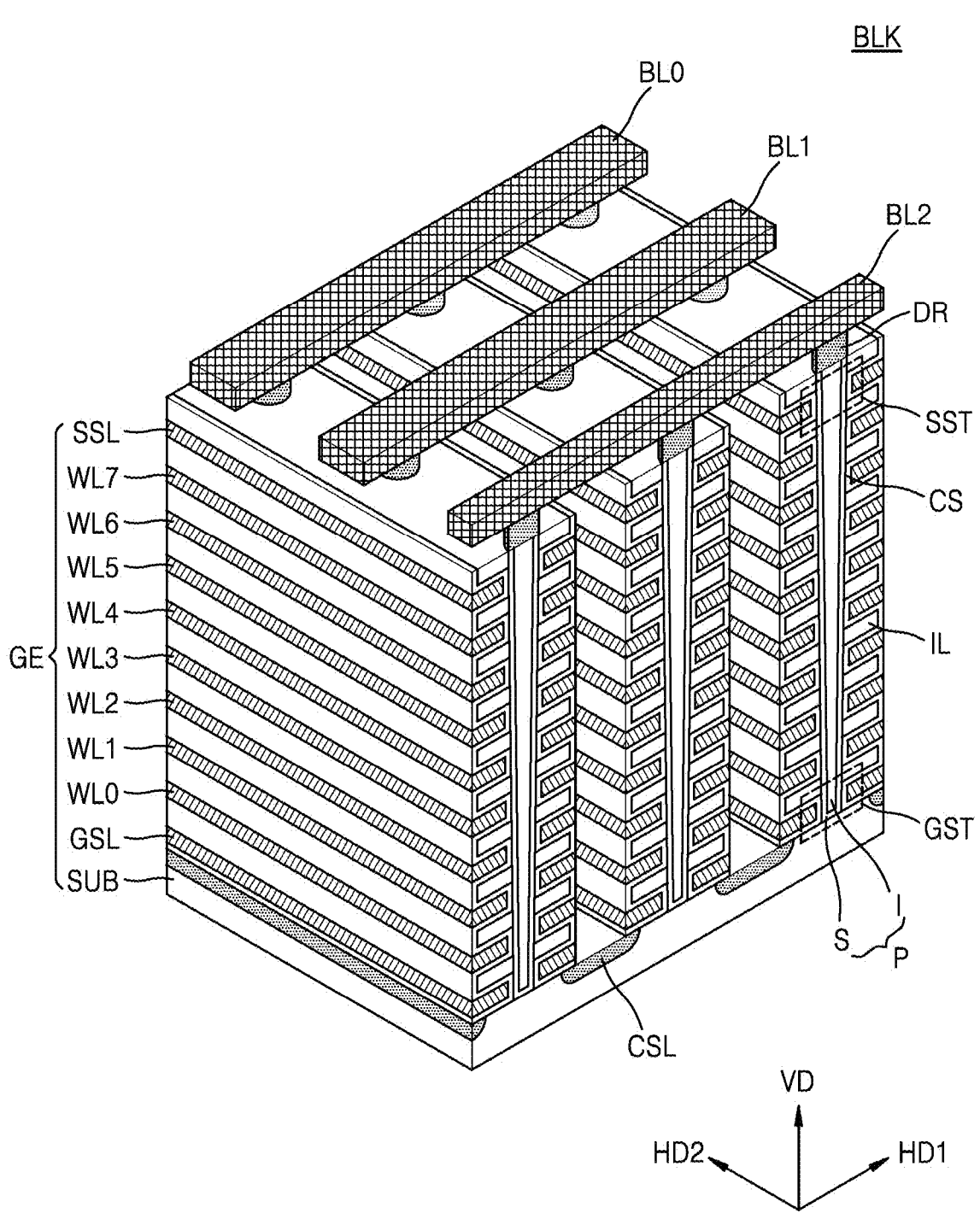
FIG. 4 is a perspective diagram illustrating an implementation example of a memory block shown in FIG. 2, according to an example embodiment.

FIG. 4 is a perspective diagram illustrating an implementation example of a memory block BLK shown in FIG. 2, according to an example embodiment.

Referring to FIG. 4, the memory block BLK is formed in a direction perpendicular to a substrate SUB. The substrate SUB has a first conductivity type (e.g., p type) and includes common source lines CSL extending on the substrate SUB in a second horizontal direction HD2 and doped with a dopant having a second conductivity type (e.g., n type). Although not shown in FIG. 4, a plurality of insulating films IL extending in the second horizontal direction HD2 are sequentially provided in a vertical direction VD on regions of the substrate SUB between adjacent common source lines CSL. The insulating films IL are apart from each other by a desired (or alternatively, predetermined) distance in the vertical direction VD. For example, the insulating films IL may include an insulating material such as silicon oxide.

On the regions of the substrate SUB between the adjacent common source lines CSL, a plurality of pillars P extending in the vertical direction VD and penetrating the insulating films IL are sequentially arranged in a first horizontal direction HD1. For example, the pillars P may penetrate the insulating films IL and come into contact with the substrate SUB. For example, a surface layer S of each of the pillars P may include a silicon material of the first conductive type and may function as a channel region. In addition, an inner layer I of each of the pillars P may include an insulating material such as silicon oxide or an air gap.

Charge storage layers CS are provided along exposed surfaces of the insulating films IL, the pillars P, and the substrate SUB on the regions between the adjacent common source lines CSL. The charge storage layers CS may each include a gate insulating layer (or referred to as a "tunneling insulating layer"), a charge trap layer, and a blocking insulating layer. For example, the charge storage layers CS may have an oxide-nitride-oxide (ONO) structure. Furthermore, gate electrodes GE such as ground selection lines GSL, string selection lines SSL, and word lines WL1 through WL8 may be provided on exposed surfaces of the charge storage layers CS on the regions between the adjacent common source lines CSL.

Drains or drain contacts DR are provided on the pillars P, respectively. For example, the drains or drain contacts DR may include a silicon material doped with a dopant having the second conductivity type. Bit lines BL1 to BL3 extending in the first horizontal direction HD1 and apart from each other by a desired (or alternatively, predetermined) distance in the second horizontal direction HD2 are provided on the drains or drain contacts DR.

Figure 5:
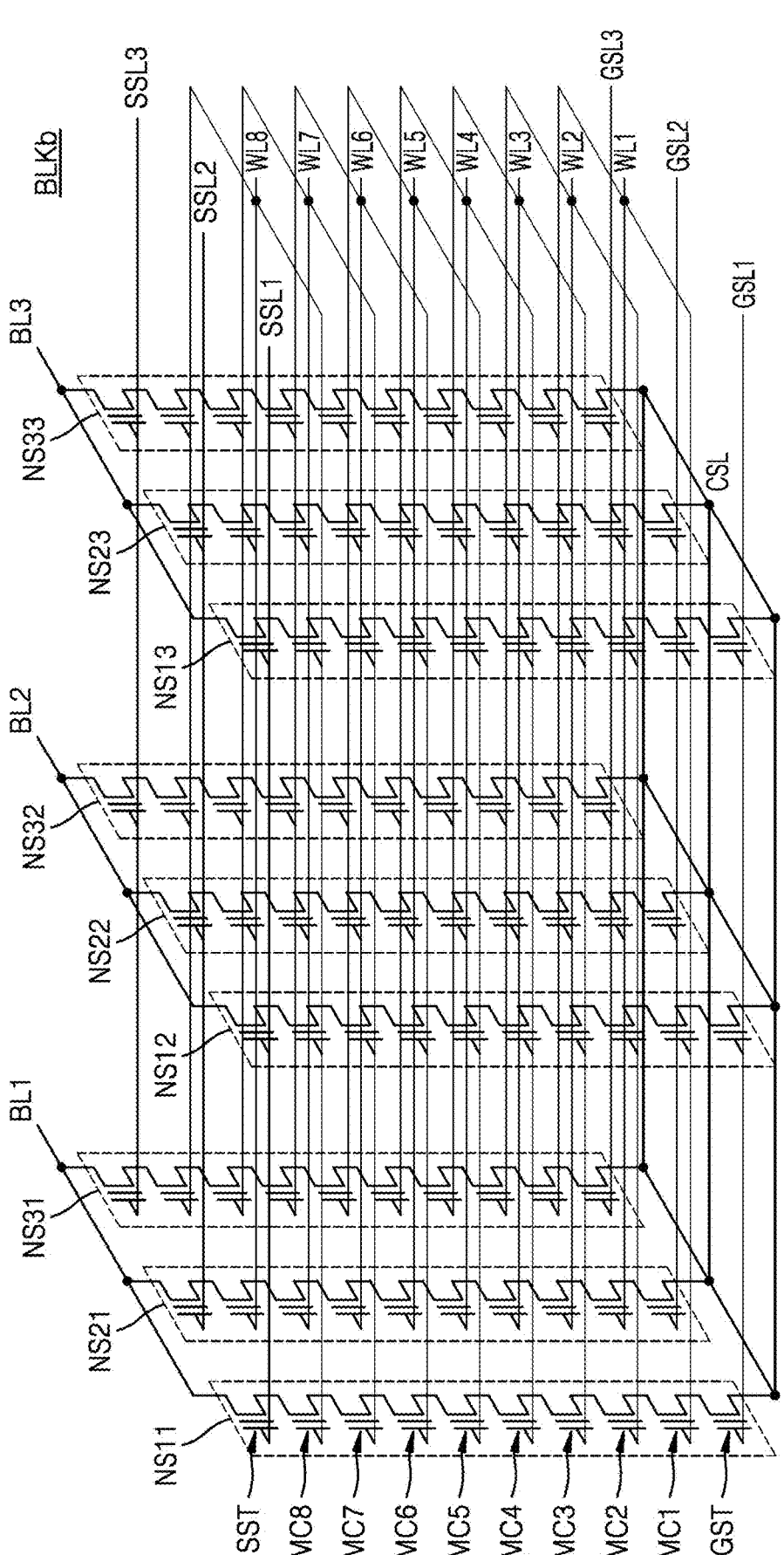
FIG. 5 is a circuit diagram illustrating another example of the memory block according to an example embodiment.

FIG. 5 is a circuit diagram illustrating another example of a memory block according to an example embodiment.

Referring to FIG. 5, a memory block BLKb may be a vertical NAND flash memory. The memory block BLKb may include a plurality of NAND strings NS11 to NS33, a plurality of word lines WL1 to WL8 (e.g., first to eighth word lines WL1 to WL8), a plurality of bit lines BL1 to BL3 (e.g., first to third bit lines BL1 to BL3), a plurality of ground selection lines GSL1, GSL2, and GSL3, a plurality of string selection lines SSL1 to SSL3 (e.g., first to third string selection lines SSL1 to SSL3), and a common source line CSL. The number of NAND strings, the number of word lines, the number of bit lines, the number of ground selection lines, and the number of string selection lines may be variously changed according to example embodiments.

The NAND strings NS11, NS21, and NS31 are provided between the first bit line BL1 and the common source line CSL, the NAND strings NS12, NS22, and NS32 are provided between the second bit line BL2 and the common source line CSL, and the NAND strings NS13, NS23, and NS33 are provided between the third bit line BL3 and the common source line CSL. Each of the NAND strings (e.g., the NAND string NS11) may include a string selection transistor SST, a plurality of memory cells MC1 to MC8, and a ground selection transistor GST that are connected in series to each other. Hereinafter, NAND strings may be referred to as strings for ease of illustration.

Strings commonly connected to one bit line may form a column. For example, the strings NS11, NS21, and NS31 commonly connected to the first bit line BL1 may correspond to a first column, the strings NS12, NS22, and NS32 commonly connected to the second bit line BL2 may correspond to a second column, and the strings NS13, NS23, and NS33 commonly connected to the third bit line BL3 may correspond to a third column.

Strings connected to one string selection line may form a row. For example, the strings NS11, NS12, and NS13 connected to the first string selection line SSL1 may correspond to a first row, the strings NS21, NS22, and NS23 connected to the second string selection line SSL2 may correspond to a second row, and the strings NS31, NS32, and NS33 connected to the third string selection line SSL3 may correspond to a third row.

The string selection transistors SST are connected to the string selection lines SSL1 to SSL3. The memory cells MC1 to MC8 are connected to the word lines WL1 to WL8 corresponding to the memory cells MC1 to MC8, respectively. The ground selection transistors GST are connected to the ground selection lines GSL1, GSL2, and GSL3. The string selection transistors SST are connected to the bit lines BL1 to BL3 corresponding to the string selection transistors SST, respectively, and the ground selection transistors GST are connected to the common source line CSL.

Word lines having the same height (e.g., word lines WL1) are connected to each other, and the string selection lines SSL1 to SSL3 are separate from each other. For example, when memory cells connected to the first word lines WL1 and included in the strings NS11, NS12, and NS13 are programmed, the first word lines WL1 and the first string selection line SSL1 are selected. In an example embodiment, the ground selection lines GSL1, GSL2, and GSL3 may be separate from each other, as shown in FIG. 5. In another example embodiment, the ground selection lines GSL1, GSL2, and GSL3 may be connected to each other.

Figure 6:
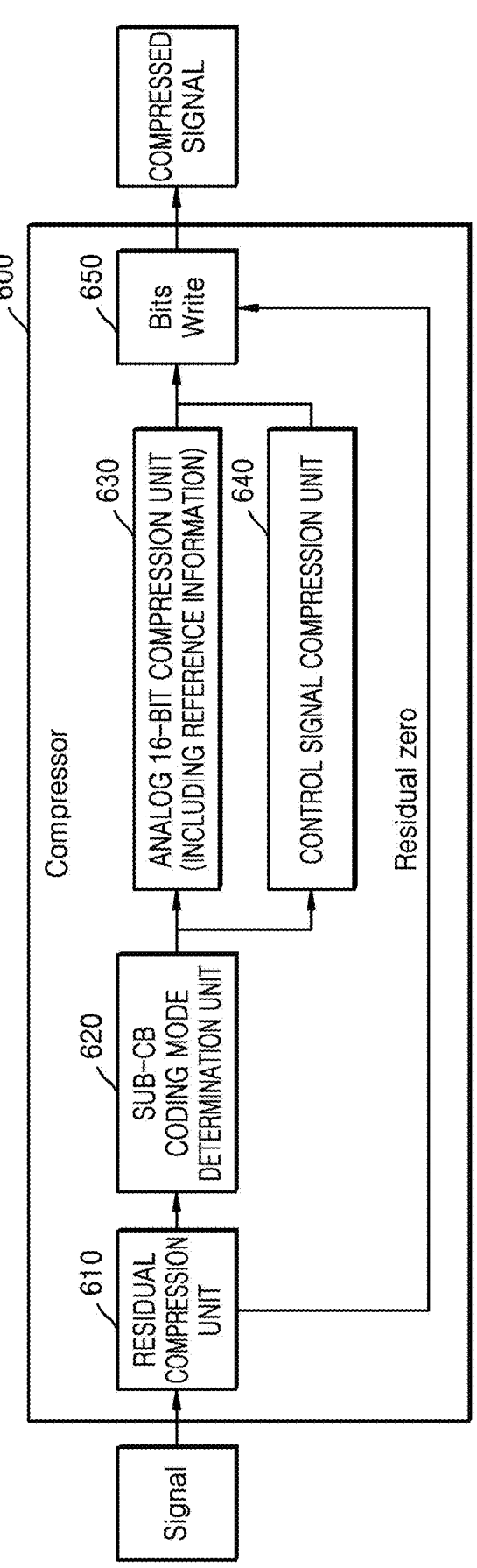
FIG. 6 is a block diagram illustrating a compressor according to an example embodiment.

FIG. 6 is a block diagram illustrating a compressor 600 according to an example embodiment.

Referring to FIG. 6, the compressor 600 may include a residual compression unit 610, a sub-coding block (CB) coding mode determination unit 620, an analog signal compression unit 630, a control signal compression unit 640, and a bit generation unit 650. Each of the units may comprises electronic circuitry.

The residual compression unit 610 may determine, based on variations in control signals, whether to perform compression. For example, the residual compression unit 610 may compare a control signal at a first time point with a control signal at a second time point. The first time point may correspond to a time point immediately before the second time point. For example, the unit of time points may be a clock unit but is not limited thereto. When the control signal at the first time point and the control signal at the second time point are not the same, the residual compression unit 610 may not perform compression because the same control signal is not repeated. The residual compression unit 610 may transmit the control signal at the second time point to the bit generation unit 650 in response to the case in which a residual between the control signal at the first time point and the control signal at the second time point is zero (e.g., meaning that the number of times the same control signal is repeated is zero). In another example, the control signal at the first time point and a control signal at a third time point may be the same. That is, the same control signal may be transmitted from the first time point to the third time point. The residual compression unit 610 may count the number of times the same control signal is repeated. Thereafter, when the repeated control signal ends and a different control signal is received, the residual compression unit 610 may transmit the counted value and the repeatedly received control signal to the sub-CB coding mode determination unit 620.

According to an example embodiment, the sub-CB coding mode determination unit 620 may determine a compression mode based on the types of control signals. For example, the types of control signals may each be one of a first type corresponding to analog 16 bits and a second type corresponding to a general control signal. The sub-CB coding mode determination unit 620 may determine the types of control signals based on masking that is desired or predetermined according to product specifications. When a control signal is of the first type, the sub-CB coding mode determination unit 620 may provide the control signal to the analog signal compression unit 630. When a control signal is of the second type, the sub-CB coding mode determination unit 620 may provide the control signal to the control signal compression unit 640.

The analog signal compression unit 630 may compress a control signal based on indexing. According to an example embodiment, voltage values applicable to word lines may each be one of desired (or alternatively, predetermined) values. For example, a voltage value applicable to each word line may be one of sixteen values. Therefore, a candidate table may be generated with respect to control information that may correspond to one of values determined or predetermined based on hardware characteristics, and the same information as control information before compression may be transmitted using only values indexing the candidate table. The analog signal compression unit 630 is further described below.

The control signal compression unit 640 may perform compression based on a residual between bits of a control signal. According to an example embodiment, the control signal compression unit 640 may operate based on a run-length compression method. For example, a control signal to be compressed may be "0000b00000". The control signal compression unit 640 may calculate a residual in the order of most significant bit (MSB) to least significant bit (LSB). The first to fourth bits are zero and may thus be replaced with "04," indicating four repetitions of zero. The fifth bit is b and may thus be replaced with "b1," indicating one repetition of b. The sixth bit to the last bit are zero and may thus be replaced with "05," indicating five repetitions of zero. That is, the control signal compression unit 640 may compress the control signal "0000b00000" to "04b105". The bit generation unit 650 may generate a bit stream by sequentially combining bits received from the residual compression unit 610, the analog signal compression unit 630, or the control signal compression unit 640.

In the example embodiment described above, an example of compressing control signals based on the run-length compression method is illustrated, but example embodiments are not limited thereto. In various example embodiments, the control signal compression unit 640 may compress bits based on various compression methods.

FIG. 7 is a block diagram illustrating the residual compression unit 610 according to an example embodiment.

Referring to FIG. 7, the residual compression unit 610 may include a flip-flop 710, a comparator 720, and a counter 730.

The flip-flop 710 may temporarily store a previously received control signal and provide the previously received control signal to the comparator 720. For example, when the comparator 720 receives a second clock (clock[1]), the comparator 720 may receive a control signal at the second clock, and a control signal at a first clock (clock[0]) from the flip-flop 710.

The comparator 720 may determine whether there is a residual between the previously received control signal and a currently received control signal. For example, when the control signal received at the first clock (clock[0]) is the same as the control signal received at the second clock (clock[1]), the comparator 720 may output 0. When the control signal received at the first clock (clock[0]) is different from the control signal received at the second clock (clock[1]), the comparator 720 may output 1.

The counter 730 may increase a count value by 1 when receiving 0 from the comparator 720. The output of the comparator 720 being 0 indicates that the same control signal has been repeatedly received, and thus, the count value may be increased by 1. The counter 730 may receive 1 from the comparator 720. The output of the comparator 720 being 1 indicates that a different control signal has been newly received, and thus, the counter 730 may output the stored count value as section information. The counter 730 may output the count value and reset the count value to 0 again.

That is, when the same control signal is repeatedly received, the output of the comparator 720 is 0, and thus, the residual compression unit 610 may only increase the count value of the counter 730 and skip outputting through an AND gate. When a new control signal is received, the output of the comparator 720 is 1, and thus, the residual compression unit 610 may output, through the counter 730, the count value immediately before the new control signal is received, and may output, through the AND gate, the control signal repeatedly received before the new control signal is received.

FIG. 8 is a diagram illustrating, by example, results obtained by the analog signal compression unit 630 according to an example embodiment.

Referring to FIG. 8, a first system 800 and a second system 810 are shown. The first system 800 shows an example in which control signals are transmitted without being compressed in the related art. In the first system 800, an encoder 801 may transmit a control signal to a decoder 803. In this case, the control signal may include information for indicating voltage values for 301 word lines, respectively. For example, the information for indicating voltage values may correspond to 16 bits. Therefore, in the first system 800, the size of a control signal indicating voltage values to be applied to all the word lines may be 301*16=4816 bits.

The second system 810 shows an example in which control signals are transmitted after being compressed according to an example embodiment. In the second system 810, an encoder 811 may compress a control signal before transmitting the control signal to a decoder 813.

The encoder 811 may perform compression based on characteristics determined by hardware. For example, a voltage value that is applicable to each of all word lines may be one of 16 values. Therefore, the encoder 811 may not indicate voltage values to be applied to the word lines by using all 16 bits per word line as in the first system 800. The encoder 811 may generate a look-up table (LUT) for voltage values to be applied to the word lines. Each entry of the LUT may be one of 16 voltage values that are applicable to the word lines. Therefore, the encoder 811 may generate LUT information to inform the decoder 813 of indexing of the LUT. In this case, 16 entries may indicate different voltage values, and thus, the size of the LUT information may be 4*16=64 bits. In addition, the encoder 811 may include, in the control signal, information indicating an entry of the LUT from which a voltage value is applied to each word line. For example, the size of the control signal indicating which entry's voltage value is to be applied to each of the 301 word lines among the 16 entries of the LUT may be 301*4=1204 bits. The encoder 811 may provide both the control signal and LUT information to the decoder 813. Therefore, the size of the control signal to be transmitted by the encoder 811 may be greatly reduced from 4816 bits to 64+1204=1268 bits by compressing the control signal.

FIG. 9 is a block diagram illustrating a decompressor 900 according to an example embodiment.

Referring to FIG. 9, the decompressor 900 may include a bit readout unit 910, a sub-CB coding mode determination unit 920, an analog signal decompression unit 930, a control signal decompression unit 940, and a residual determination unit 950. Each of the units may comprises electronic circuitry.

The bit readout unit 910 may receive a compressed control signal and may obtain a bit stream based on the received compressed control signal.

According to an example embodiment, the sub-CB coding mode determination unit 920 may determine a decompression mode based on the types of control signals. For example, the types of control signals may each be one of a first type corresponding to analog 16 bits and a second type corresponding to a general control signal. The sub-CB coding mode determination unit 920 may determine the types of control signals based on masking that is desired (or alternatively, predetermined) according to product specifications. When a control signal is of the first type, the sub-CB coding mode determination unit 920 may provide the control signal to the analog signal decompression unit 930. When a control signal is of the second type, the sub-CB coding mode determination unit 920 may provide the control signal to the control signal decompression unit 940.

The analog signal decompression unit 930 may decompress a compressed control signal based on indexing. According to an example embodiment, voltage values applicable to word lines may each be one of desired (or alternatively, predetermined) values. For example, a voltage value applicable to each word line may be one of 16 values. Therefore, a decompressed control signal may be generated by identifying a voltage value corresponding to an index value for each word line.

The control signal decompression unit 940 may decompress a control signal based on a compression method by which the control signals was compressed. For example, when the compression method is based on a run-length compression method, the control signal decompression unit 940 may decompress "04b105". For example, because four repetitions of '4' was replaced with '04', the control signal decompression unit 940 may identify '0000' sequentially from the MSB. Then, because one repetition of 'b' was replaced with 'b1', the control signal decompression unit 940 may identify 'b'. Then, because five repetitions of '0' was repeated with '05', the control signal decompression unit 940 may identify '00000'. Thereafter, the control signal decompression unit 940 may restore "0000b00000" by connecting the bits identified sequentially from the MSB to the LSB. In other words, the control signal decompression unit 940 may restore a first control signal and a second control signal.

The residual determination unit 950 may receive the first control signal and the second control signal from the control signal decompression unit 940 and may identify a difference between the first control signal and the second control signal.

In the example embodiment above, an example of decompressing a control signal based on the run-length compression method is described. However, example embodiments are not limited thereto. In various example embodiments, the control signal decompression unit 640 may decompress control signals based on various compression methods.

FIG. 10 is a block diagram illustrating an example of applying memory devices to an SSD system 500 according to example embodiments.

Referring to FIG. 10, the SSD system 500 may include a host 510 and an SSD 520. The SSD 520 may exchange signals SIG with the host 510 through a signal connector and receive power PWR through a power connector. The SSD 520 may include an SSD controller 621, an auxiliary power supply 522, and memory devices 523_1 to 523_n. The memory devices 523_1 to 523_n may be vertically stacked NAND flash memory devices. The SSD controller 621 may be connected to the memory devices 523_1 to 523_n through a plurality of channels Ch1 to Chn. In this case, each of the memory devices 523_1 to 523_n may be implemented using the example embodiments described with reference to FIGS. 1 to 10.

The SSD controller 621 may include an error correction code (ECC) circuit 521_1 and an advanced encryption standard (AES) circuit 521_2. In addition, although not shown in FIG. 10, the SSD controller 621 may further include components such as a processor, a buffer, random access memory (RAM), a host interface, and a memory interface to control the overall operation of the SSD 520.

The ECC circuit 521_1 may perform ECC encoding and ECC decoding on data stored in or read from the memory devices 523_1 to 523_n. For example, the ECC circuit 521_1 may generate parity for error detection and correction when performing ECC encoding on write data, and perform error detection and correction operations based on data and parity read from the memory devices 523_1 to 523_n. In addition, the AES circuit 521_2 may perform at least one of encryption and decryption operations on data input/output to/from the SSD controller 621. The AES circuit 521_2 may perform encryption and decryption operations using various types of encryption/decryption algorithms (e.g., a symmetric-key algorithm).

As described above, according to the one or more of the above example embodiments, control signals are compressed to decrease the size of memory for a controller and the burden of routing control signals.

Any functional blocks shown in the figures and described above may be implemented in processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Effects obtainable from example embodiments are not limited to the effects mentioned above, and other effects not mentioned above may be clearly derived and understood based on the description given herein by those of ordinary skill in the art to which the disclosed example embodiments pertain. In other words, unintended effects resulting from the implementation of the disclosed example embodiments may also be derived by those of ordinary skill in the art from the disclosed example embodiments.

It should be understood that the disclosed example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A compressor for compressing a control signal, the compressor comprising:
    residual compression circuitry configured to sequentially receive a first control signal and a second control signal and perform a first compression based on a difference between the first control signal and the second control signal;
    coding mode determination circuitry configured to determine a coding mode based on a type of control signal;
    analog signal compression circuitry configured to perform a second compression based on indexing; and
    control signal compression circuitry configured to perform a third compression based on run-length encoding (RLE).

2. The compressor of claim 1, wherein the residual compression circuitry comprises:
    a flip-flop configured to temporarily store the first control signal;
    a comparator configured to identify the difference between the first control signal and the second control signal; and
    a counter.

3. The compressor of claim 2, wherein the counter is configured to,
    when the first control signal and the second control signal are identical to each other, increase a count value, and
    when the first control signal and the second control signal are different from each other, output the count value as section information and then reset the count value.

4. The compressor of claim 1, wherein the analog signal compression circuitry is further configured to
    index voltage values applicable to word lines into a look-up table (LUT) based on hardware characteristics, and
    map an index value of the LUT to each of the word lines.

5. The compressor of claim 1, wherein the control signal compression circuitry is further configured to, when an identical bit value successively repeats in control signal data, perform the third compression by expressing, as a pair, the identical bit value and a number of repetitions of the identical bit value.

6. A memory system comprising:
    an external device comprising a compressor configured to generate a compressed control signal by compressing data for identifying characteristics of storage device memory cells; and
    a storage device comprising an external NAND control (ENC) circuit and a nonvolatile memory device, the ENC circuit comprising a buffer memory and a decompressor, the buffer memory configured to store the compressed control signal, the decompressor configured to generate a control signal by performing decompression based on the compressed control signal, the nonvolatile memory device comprising a memory cell array, wherein the data comprises control information for implementing a hardware algorithm.

7. The memory system of claim 6, wherein the compressor comprises:
    residual compression circuitry configured to sequentially receive a first control signal and a second control signal and perform a first compression based on a difference between the first control signal and the second control signal;
    coding mode determination circuitry configured to determine a coding mode based on a type of control signal;
    analog signal compression circuitry configured to perform a second compression based on indexing; and
    control signal compression circuitry configured to perform a third compression based on run-length encoding (RLE).

8. The memory system of claim 7, wherein the residual compression circuitry comprises:
    a flip-flop for temporarily storing the first control signal;
    a comparator configured to identify the difference between the first control signal and the second control signal; and
    a counter.

9. The memory system of claim 8, wherein the counter is configured to,
    when the first control signal and the second control signal are identical to each other, increase a count value, and
    when the first control signal and the second control signal are different from each other, output the count value as section information and then reset the count value.

10. The memory system of claim 7, wherein the analog signal compression circuitry is further configured to
    index voltage values applicable to word lines into a look-up table (LUT) based on hardware characteristics, and
    map an index value of the LUT to each of the word lines.

11. The memory system of claim 7, wherein the control signal compression circuitry is further configured to, when an identical bit value successively repeats in control signal data, perform the third compression by expressing, as a pair, the identical bit value and a number of repetitions of the identical bit value.

12. The memory system of claim 6, wherein the decompressor comprises:
    coding mode determination circuitry configured to determine a coding mode based on a type of control signal;
    analog signal decompression circuitry configured to perform a first decompression based on indexing;
    control signal decompression circuitry configured to perform a second decompression based on run-length encoding (RLE) to restore a first control signal and a second control signal; and
    residual determination circuitry configured to identify a difference between the first control signal and the second control signal.

13. The memory system of claim 6, wherein the external device further comprises a field programmable gate array (FPGA).

14. A storage device comprising:
    a compressor comprising residual compression circuitry, coding mode determination circuitry, analog signal compression circuitry, and control signal compression circuitry, the residual compression circuitry configured to sequentially receive a first control signal and a second control signal and perform a first compression based on a difference between the first control signal and the second control signal, the coding mode determination circuitry configured to determine a coding mode based on a type of control signal, the analog signal compression circuitry configured to perform a second compression based on indexing, and the control signal compression circuitry configured to perform a third compression based on run-length encoding (RLE);

a decompressor comprising coding mode determination circuitry, an analog signal decompression circuitry, a control signal decompression circuitry, and residual determination circuitry, the coding mode determination circuitry configured to determine a coding mode based on a type of control signal, the analog signal decompression circuitry configured to perform a first decompression based on indexing, the control signal decompression circuitry configured to perform a second decompression based on RLE, and the residual determination circuitry configured to identify the difference between the first control signal and the second control signal; and a nonvolatile memory device comprising a memory cell array, a voltage generator, a row decoder, and a page buffer.

15. The storage device of claim 14, wherein the residual compression circuitry comprises a flip-flop configured to temporarily store the first control signal.

16. The storage device of claim 15, wherein the residual compression circuitry further comprises:

a comparator configured to identify the difference between the first control signal and the second control signal; and a counter.

17. The storage device of claim 16, wherein the counter is configured to increase a count value when the first control signal and the second control signal are identical to each other.

18. The storage device of claim 17, wherein the counter is further configured to output the count value as section information and then reset the count value when the first control signal and the second control signal are different from each other.

19. The storage device of claim 14, wherein the analog signal compression circuitry is further configured to index voltage values applicable to word lines into a look-up table (LUT) based on hardware characteristics and map an index value of the LUT to each of the word lines.

20. The storage device of claim 14, wherein the control signal compression circuitry is further configured to, when an identical bit value successively repeats in control signal data, perform the third compression by expressing, as a pair, the identical bit value and a number of repetitions of the identical bit value.

* * * * *